(12) United States Patent
Mobley

(10) Patent No.: US 6,538,928 B1
(45) Date of Patent: Mar. 25, 2003

(54) METHOD FOR REDUCING THE WIDTH OF A GLOBAL DATA BUS IN A MEMORY ARCHITECTURE

(75) Inventor: Kenneth J. Mobley, Colorado Springs, CO (US)

(73) Assignee: Enhanced Memory Systems Inc., Colorado Springs, CO (US)

( * ) Notice: Subject to any disclaimer, the term of this patent is extended or adjusted under 35 U.S.C. 154(b) by 0 days.

(21) Appl. No.: 09/689,219

(22) Filed: Oct. 11, 2000

Related U.S. Application Data

(60) Provisional application No. 60/158,359, filed on Oct. 12, 1999.

(51) Int. Cl.[7] ............................................. G11C 16/04
(52) U.S. Cl. ............................. 365/189.05; 365/189.08; 365/205; 365/207
(58) Field of Search ............................. 365/185.13, 205, 365/189.05, 230.08, 203, 207, 189.07, 189.08, 189.02

(56) References Cited

U.S. PATENT DOCUMENTS

| | | | | |
|---|---|---|---|---|
| 5,544,306 A | * | 8/1996 | Deering et al. | 345/531 |
| 5,787,457 A | * | 7/1998 | Miller | 365/185.13 |
| 5,887,272 A | | 3/1999 | Sartore et al. | 711/105 |
| 6,134,153 A | * | 10/2000 | Lines et al. | 365/189.02 |
| 6,144,577 A | * | 11/2000 | Hidaka | 365/212 |
| 6,205,071 B1 | * | 3/2001 | Ooishi | 365/205 |
| 6,347,058 B1 | * | 2/2002 | Houghton et al. | 365/149 |

OTHER PUBLICATIONS

Enhanced Memory Systems, Inc., "Preliminary Data Sheet, 16Mbit Enhanced Synchronous DRAM", © 1999 Enhanced Memory Systems, Inc., http:/www.edram.com, pp. 7 and 8 of 100.

Micron, "Technical Note—Reduce Dram Memory Costs with Cache", Published 1994, © 1999 Micron Technology, Inc., pp. 1–4.

* cited by examiner

Primary Examiner—Michael S. Lebentritt
Assistant Examiner—Hien Nguyen
(74) Attorney, Agent, or Firm—Hogan & Hartson L.L.P.

(57) ABSTRACT

A memory architecture uses shared sense amplifiers (18–23) and a centralized cache (26–29) that contains M bits. The memory architecture also includes a global bus (31) connecting the sense amplifiers and the centralized cache. The global bus includes n bits, and n<M bits are transferred in M/n cycles to the centralized cache.

24 Claims, 2 Drawing Sheets

METHOD FOR REDUCING THE WIDTH OF A GLOBAL DATA BUS IN A MEMORY ARCHITECTURE

CROSS REFERENCE TO RELATED APPLICATION

This application claims the benefit of prior filed provisional application Ser. No. 60/158,359, filed Oct. 12, 1999.

BACKGROUND OF THE INVENTION

1. Field of the Invention

This invention relates to improvements in memory architectures and methods for operating same, and more particularly, to improvements in memory architectures and operations thereof for improved data transfers between the memory array and a cache memory associated therewith, and still more particularly to improvements in systems and methods for sharing sense amplifiers in a memory architecture that enables the width of a global data bus (e.g., implemented using a global metalization layer) to be reduced in size by multiplexing data from the shared sense amplifiers to the centralized cache during subsequent clock cycles.

2. Relevant Background

Today, in memory architectures, in general, and DRAM architectures, in particular, one physical circuit layout that has been suggested includes sets of sense amplifiers alternating with memory array blocks serviced by the sense amplifiers. See, for example, U.S. Pat. No. 5,887,272, which is assigned to the assignee hereof, and which is incorporated herein by reference. The sense amplifiers are arranged in stripes between adjacent DRAM array blocks. Each sense amplifier stripe may be connected to selectively service the DRAM cells on both sides of the stripe. Thus, the sense amplifiers in a particular sense amplifier stripe may be selectively connected to selected memory cells on either the memory array located on left of the stripe, or to selected memory cells located on the right of the stripe.

One trend in the design of memory devices is to increase their access speeds. In this regard, it has been proposed to include cache memory elements into which the contents of the DRAM array are temporarily written prior to being delivered to the output of the memory. The cache memory serves to hide the overhead associated with the DRAM array by allowing the data access to occur while the precharge and next activation of the array is underway. This effectively speeds up the overall data rate by eliminating otherwise dead periods. As used herein, the terms "cache" or "cache memory" are used to refer to a data latch or other suitable circuit that can temporarily hold the data as it is read from the DRAM array prior to being delivered to the output of the memory. Thus, in the past, when an element from the memory array is read, it is detected by a sense amplifier that is associated with the memory cell being read, then delivered from the sense amplifier to the cache memory element that is at least temporarily associated therewith.

Additionally, memory arrays are becoming more and more dense. For example, DRAM designers are under constant tension to design DRAM circuits more densely, but at the same time, to include larger amounts of functionality in the circuit. One of the techniques that integrated circuit manufacturers have used to address these problems is to place greater and greater emphasis on multi-layered structures. For example, above the active regions of the device, one or more layers of interconnecting metal or other conducting material, such as polysilicon, or the like, may be used. However, as the number of the layers increases, the planarity of the surface on which subsequent layers are formed becomes increasingly uneven. As a result, the overlying or subsequently formed structures have a tendency to be susceptible to discontinuities, due to step-like structures that form at the surface. As a result, the pitch of the interconnect structures generally cannot be designed at too low a level. (The pitch of an interconnect is regarded as the distance between an interconnect structure and its closest neighbor, plus the dimension of the interconnect itself.)

One of the problems that has been encountered is in the interconnect structure between the cache array elements and the respective sense amplifiers. Since the interconnect must traverse at least a portion of the surface overlying the memory array, in modern DRAMs, typically only a few cache elements are provided with a respective few sense amplifiers, so that only a portion of a row, for example, of the DRAM array is read out. This requires a number of memory access cycles to be preformed in order to read out the plurality of memory array locations desired. An alternative structure that has been proposed is to provide cache memory elements in close proximity to the sense amplifiers.

However, typically, the cache memory elements are arranged physically in a stripe that is associated both with the DRAM array and with the sense amplifier stripes in which the circuit is laid out. One problem with the practical implementation of a centralized cache shared between multiple sense amplifier "bands" or stripes is caused by the previous inability to implement the global busses required to connect the sense amplifiers to the cache bits on the DRAM sense amplifier pitch. For example, in a memory that has an 8K bit page size, a global bus having 16K lines must be provided, one line per bit and one line per bit compliment. This is prohibitively large. That is, for the sense amplifiers to be closely packed to enable global lines to be routed from the sense amplifiers to the centralized cache, practically speaking, the sense amplifiers needed to be shared among the global bus lines. This constraint results in the cache having fewer bits than the number of bits held in an active set of sense amplifiers.

Furthermore, each time that the DRAM array is accessed, it must be precharged. Precharging the DRAM array erases any previously contained information in the sense amplifiers. Thus, the reading out of a single row of DRAM memory may entail several cycles of precharge and reading, due to the limited number of bus traces or lines that can practically be used to interconnect the sense amplifiers and cache elements.

What is needed, therefore, is a memory architecture and method of operation that enables the memory to be operated with a plurality of shared sense amplifiers and a centralized cache in which a global bus connects the sense amplifiers and the centralized cache, but the number of bits simultaneously transferred is less than the number of sense amplifiers, and the memory array needs to be precharged only once for the entire data transfer.

SUMMARY OF THE INVENTION

In light of the above, therefore, it is an object of the invention to provide a DRAM integrated circuit in which a number of bus lines that interconnect the sense amplifiers and cache elements associated therewith can be reduced.

It is another object of the invention to provide a DRAM array in which a row, or other portion, of the DRAM can be read and transferred to a cache memory with only a single DRAM array precharge being required.

It is another object of the invention to provide a method for operating a DRAM for transferring data from the memory cells of the DRAM array to a cache memory without requiring subsequent DRAM array precharge after the first.

It is another object of the invention to provide a memory architecture that enables a smaller amount of chip space to be used, while enabling rapid memory read accesses.

These and other objects, features and advantages of the invention will be apparent to those skilled in the art from the following detailed description of the invention, when read in conjunction with the accompanying drawings and appended claims.

In accordance with a broad aspect of the invention, a memory architecture is presented that uses shared sense amplifiers and a centralized cache, which contains M bits. A global bus, which includes n bits, connects the sense amplifiers and the centralized cache. In operation, n<M bits are transferred in M/n cycles to the centralized cache. The ratio n:M may be, for example, 1:2, 1:3, or other convenient ratio.

According to another broad aspect of the invention, a memory is presented that includes a memory array of cells having stored memory contents. A first sense amplifier array receives memory contents of a selectively associated first plurality of cells in the memory array. A second sense amplifier array receives memory contents of a selectively associated second plurality of cells in the memory array. A cache receives the memory contents from the first and second sense amplifier arrays. A bus connects the first and second sense amplifier arrays to the cache, and a circuit sequentially transfers the memory contents of the first sense amplifier array to a first portion of the cache and transferring the memory contents of the second sense amplifier array to another portion of the cache.

According to another broad aspect of the invention, a method is presented for operating a memory. The method includes precharging a memory array, sensing a first portion of addressed memory elements of the memory array in a first sense amplifier array, and concurrently sensing a second portion of the addressed memory elements of the memory array in a second sense amplifier array. The sensed first portion of the addressed memory elements of the first sense amplifier array are transferred to a cache; and, subsequently, the sensed second portion of the addressed memory elements of the second sense amplifier array are transferred to the cache. Preferably the subsequent transfer of the sensed second portion of the addressed memory elements of the second sense amplifier array to the cache is accomplished without precharging the memory array after the transferring the sensed first portion of the addressed memory elements of the first sense amplifier array.

According to one embodiment of the invention, the method further includes determining a burst order required such that data necessary for a first portion of a burst is transferred on a first bus cycle, and data necessary for a second portion of the burst is transferred on a second bus cycle.

BRIEF DESCRIPTION OF THE DRAWINGS

The invention is illustrated in the accompanying drawings, in which.

In the various figures of the drawing, like reference numerals are used to denote like or similar parts.

DESCRIPTION OF THE PREFERRED EMBODIMENT

According to the present invention, the contents of a memory array, in general, and a DRAM array, in particular, are sensed in turn and delivered over a common interconnecting bus between the addressed elements of the memory array and a cache memory from first and second memory portions. The memory is accessed in the respective access cycles without being precharged in between accesses. As a result, the memory speed is significantly improved.

Figure 1:
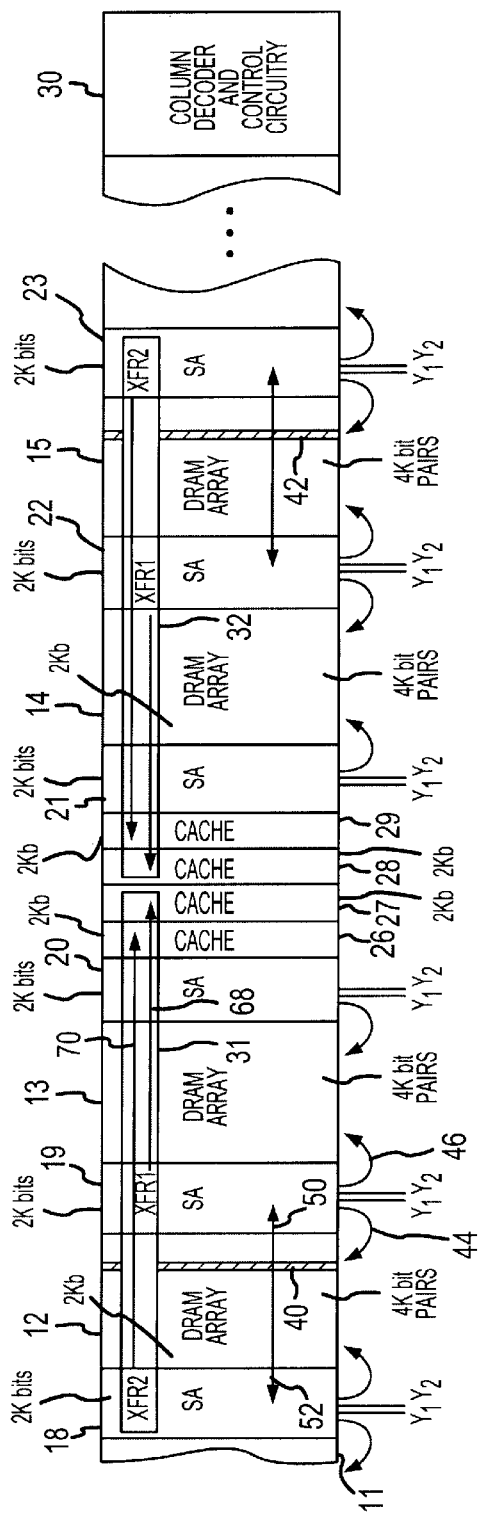
FIG. 1 is a diagram showing a physical DRAM layout illustrating the relationship between the various DRAM arrays, sense amplifier stripes, cache memory stripes, and global bus interconnecting the sense amplifiers and cache memory, in accordance with a preferred embodiment of the invention.

With reference now to FIG. 1, a possible physical DRAM layout is shown, illustrating the relationship between various DRAM arrays 12–15, sense amplifier stripes 18–23, cache memory stripes 26–29, and global buses 31 and 32 interconnecting the sense amplifiers and cache memory, in accordance with a preferred embodiment of the invention. The DRAM arrays 12–15 are of typical construction in which memory cells are arranged in selectively addressable rows and columns. As shown, a number of DRAM arrays may be provided, depending upon the size of the memory elements to be provided. The collection of DRAM arrays and associated circuitry may be served by a column decoder and control circuitry 30.

Each of the sense amplifiers contained in the sense amplifier stripes 18–23 is selectively connected in known manner to a selectively associated DRAM array so that when a particular row and column of the DRAM elements are addressed, the contents of the memory cells at the addressed locations are sensed by the respective sense amplifiers. As shown, the sense amplifiers may be physically located on each side of the DRAM array. Thus, for instance, a first portion of the contents of an addressed row 40 of memory array 12 are sensed by the sense amplifiers of the sense amplifier stripe 18 on the left, and a second portion of the contents of the addressed row 40 of memory array 12 are sensed by the sense amplifiers of the sense amplifier 19 on the right. In a symmetrical operation, a first portion of the contents of an addressed row 42 of memory array 15 are sensed by the sense amplifiers of the sense amplifier stripe 22 on the left, and a second portion of the contents of the addressed row 42 of memory array 15 are sensed by the sense amplifiers of the sense amplifier 23 on the right.

It should be noted that although the sense amplifiers are preferably id located on respective opposite sides of the DRAM arrays, they may be located on a single side thereof; however, this may entail the use of additional undesired wiring or interconnect between the DRAM array and the respective sense amplifiers. It is also noted that the sense amplifiers are preferably, but not necessarily, shared between adjacent DRAM arrays, as shown. Thus, for example, the sense amplifier 19 may be selectively connected to sense the row contents of either DRAM array 12 or DRAM array 13, as denoted by the arrows 44 and 46.

In accordance with the invention, a cache memory is provided. As shown the cache memory may include four (or other number) of cache memory stripes 26–29 may be physically located between a set of sense amplifiers 20 and 21. Each of the cache memory stripes 26–29 may be of the same size as a corresponding one of the sense amplifier stripes 18–23. For example, in a 256K DRAM, each of the DRAM arrays 12–15 may be sized with 4K bit memory pairs per row, and each sense amplifier stripe 18–23 and each cache memory stripe 26–29 may be of 2K bits. Thus, an addressed row of a selected DRAM array can be sensed by the sense amplifiers of two sense amplifier stripes and moved into the cache memory elements of a respective two cache strips, in a manner below described in detail.

A global interconnect bus is provided by which the contents of the sense amplifiers are selectively connected to the cache memory. In the symmetrical embodiment illustrated, two global buses 31 and 32 are employed. Each bus is shared between the sense amplifiers of the two sense amplifier stripes associated with a selected DRAM array, and the cache memory elements of a respective pair of cache memory stripes. Thus, for example, in the embodiment illustrated, if the row 40 in the DRAM array 12 is selectively addressed, the sense amplifier stripes 18 and 19 are activated. The global bus 31 is then associated with the sense amplifiers contained in the stripes 18 and 19 to connect them to the cache memory elements of cache memory stripes 26 and 27. A similar connection may be made between the sense amplifiers 22 and 23 associated with the DRAM array 15 to the cache memory elements of the cache memory stripes 28 and 29.

Thus, the number of required bus lines from the sense amplifiers to the cache memory elements is one-half that which would be required if a single dedicated bus line were provided between each sense amplifier and its respective cache memory element cell. For instance, in the embodiment illustrated, the bus need be only 2Kb wide. This significantly reduces the pitch requirements of the global bus lines, which typically would be formed of upper level metal during the DRAM fabrication process. As will become apparent, in the embodiment illustrated, the data is moved over the global bus from two sense amplifier stripes to a respective two cache memory stripes in subsequent clock cycles, without additional memory array precharge, the bus may be associated with more than, or fewer than, two sense amplifier stripes to connect to a respective number of cache memory stripes in a respective number of successive clock cycles. For example, multiple transfers might be made from a single sense amplifier stripe into multiple cache stripes, and so on.

In operation, the data in an addressed row, such as the row 40 of the DRAM array 12, is sensed by the sense amplifiers contained in the sense amplifier stripes 18 and 19 on each side of the DRAM array 12, as denoted by arrows 50 and 52. As described in more detail below, the system clock that is being used in the operation of the DRAM, shown in FIG. 2, may be used to selectively connect the bus 31 sequentially from the sense amplifiers of the sense amplifier stripes 18 and 19 at each respective side of the DRAM array 12 to the cache memory elements of respective cache stripes 26 and 27.

More particularly, on a first clock cycle 60, the DRAM bank may be activated. Subsequently, for example, after 3 clock cycles, upon the rising edge 62 of the clock, a read auto precharge command may be issued. The next successive two rising edges 64 and 66 of the clock produce first a transfer of the contents of the sense amplifiers of stripe 19 to the cache memory elements of cache memory stripe 27, and second transfer of the contents of the sense amplifiers of stripe 18 to the cache memory elements of cache memory stripe 26, as shown by arrows 68 and 70. Of course, the clock cycles need not be successive, as shown, but may be separated by a number of intermediate clock cycles. Following the completion of the data transfer from the sense amplifier stripes 18 and 19 to the cache memory stripes 26 and 27, the DRAM may be precharged at a subsequent clock cycle 72. In the symmetrical embodiment shown, a similar and simultaneous transfer may be performed to move the data from the addressed row 42 of the DRAM array 15 to the cache stripes 28 and 29. It should be noted that transfers need not necessarily be synchronized to an external clock, but may occur based upon internally generated timing pulses.

It should be noted that as a result of the shared bus lines connecting to the cache memory, the data has been completely read into all of the cache memory stripes. Consequently, the DRAM array does not need to be precharged between successive line outputs. The result is a significantly increased DRAM speed.

Figure 2:
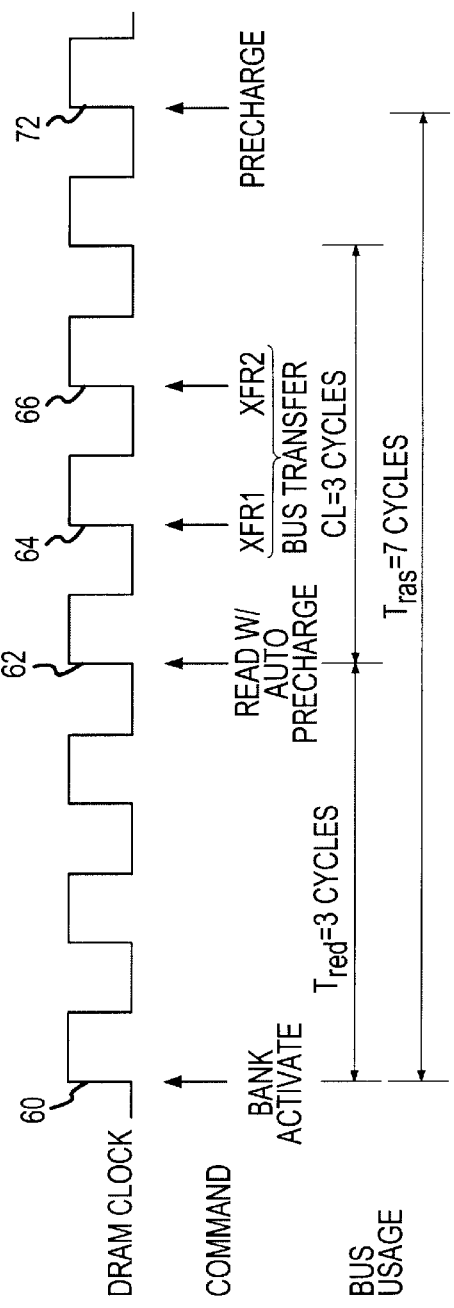
FIG. 2 shows timing diagrams and event occurrence timings in the operation of the memory of FIG. 1, in accordance with a preferred embodiment of the invention.

Thus, the shared sense amplifiers of the architecture of FIG. 1 include a global metalization layer (interconnect layer) that carries n of M bits of data from the sense amplifiers to the centralized cache per clock cycle (n being the number of bits of the sense amplifier and its associated cache memory and M being the addressed memory elements of the DRAM array.) In the case of an n to M ratio of 1:2 illustrated, the centralized cache can be fully populated in two clock cycles (labeled as xfr 1 and xfr 2 in FIGS. 1 and 2). It should be noted that in the embodiment illustrated, both transfers come from both sense amplifier stripes. Another method that may be employed is to perform transfer 1 from one stripe, and transfer 2 from the other. As shown in FIG. 2, since the $T_{ras}$ time dominates the operation of the memory device, the bus transfers to the cache can be performed transparently before the data (labeled D1 through D8) is output. Furthermore, rather than a bus from the sense amplifier to the centralized cache that uses half of the number of cache bits, one third of the number of lines can be used if the data is transmitted in three cycles, thus further reducing the size of the bus.

The bus utilization would not interfere with the burst access timing so long as the bus multiplexing sequence is chosen to ensure that the information needed to fulfill the burst is transferred on the first transfer cycle. Thus, according to one aspect of the invention, a method for performing the method of the invention may include determining a burst order required such that data necessary for a first portion of a burst is transferred on a first bus cycle, and data necessary for a second portion of the burst is transferred on a second bus cycle. Furthermore, it is possible (depending on the clock rate relative to the core speed and other factors) that the multiple bus cycles may not delay the array precharge since the delay to precharge may be dictated by the $T_{RAS}$ requirements of the DRAM core, as shown in FIG. 2.

Figure 3:
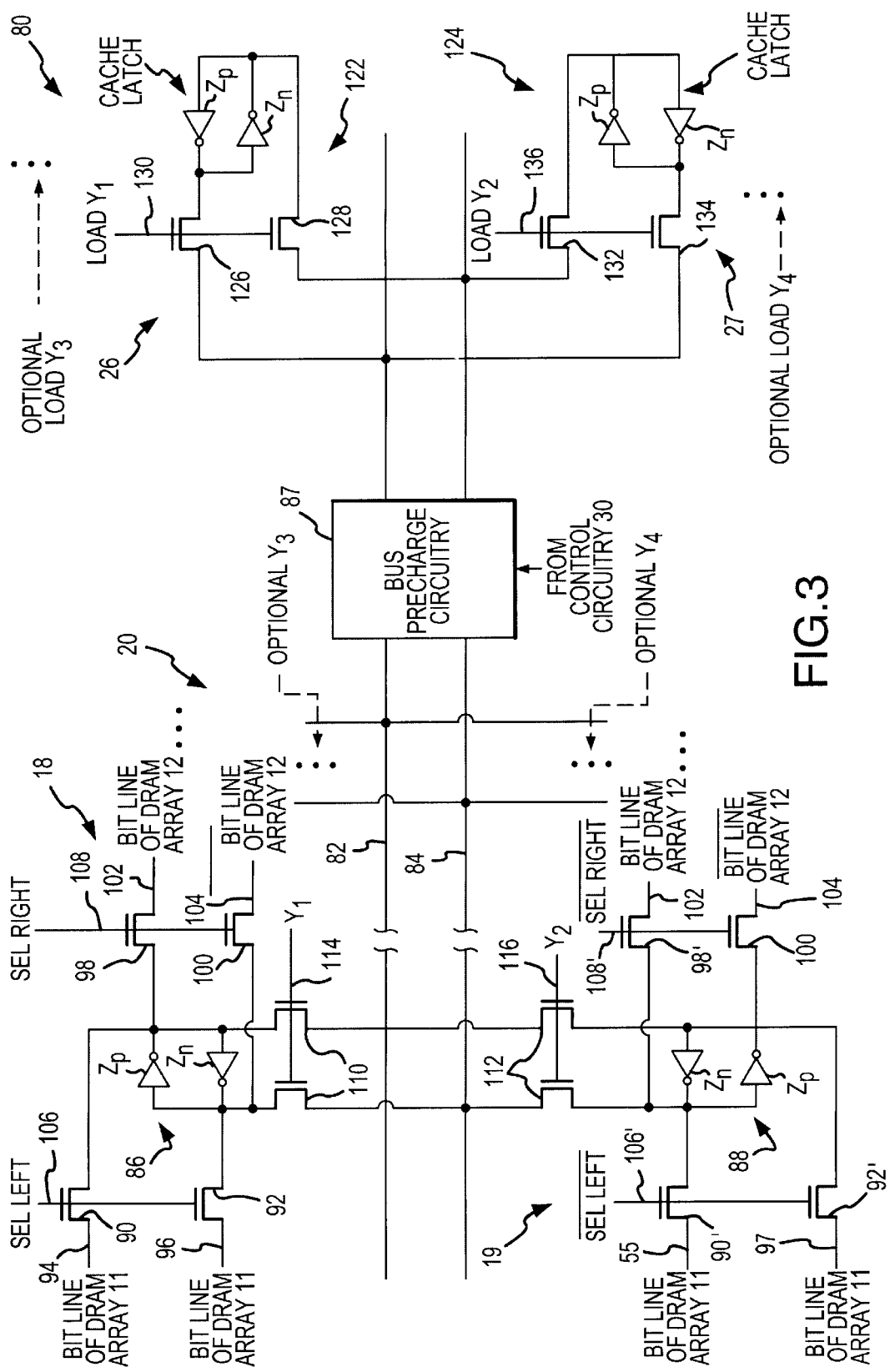
FIG. 3 is an electrical schematic diagram of a pair of sense amplifiers, cache latches, global bus, and selection logic used in the operation of the memory of FIG. 1, in accordance with a preferred embodiment of the invention.

A portion of a circuit 80, showing one technique for effecting the sense amplifier selection and data transfer to the cache memory, is shown in FIG. 3, to which reference is now additionally made. Two lines 82 and 84 of the global bus 31 are connected to the sense amplifiers of the various sense amplifier stripes, for example portions of stripes 18 and 19 being shown. Bus precharge circuitry 87 is provided to precharge the global bus 31, under control of the control circuitry 30 (FIG. 1).

A data latch 86, for example, of the sense amplifier stripe 18, and data latch 88, for example, of the sense amplifier stripe 19, from opposite sides of an active DRAM array 12 are provided for latching data of addressed memory cells of the active memory array 12. Although the circuitry of the sense amplifiers 18 and 19 are shown vertically aligned, it is understood that the physical arrangement of the sense amplifiers is not critical to practicing the data transfer techniques of the invention, and that many other arrangements may be used.

Thus, pass gate transistors 90 and 92 connect the bit lines 94 and 96 to the latch 86 of sense amplifier 18 from the DRAM array 11 on the left. Similarly, pass gate transistors 98 and 100 connect the bit lines 102 and 104 to the latch 86 of the sense amplifier 18 from the DRAM array 12 on the right. (In the example shown, it is assumed that DRAM array 12 is active; consequently, transistors 98 and 100 would be active, while transistors 90 and 92 would be turned off.)

Similarly, pass gate transistors 90' and 92' connect the bit lines 95 and 97 to the latch 88 of sense amplifier 19 from the DRAM array 12 on the left. Similarly, pass gate transistors 98' and 100' connect the bit lines 102 and 104 to the latch 88 of the sense amplifier 19 from the DRAM array 12 on the right. (Again, in the example shown, it is assumed that DRAM array 12 is active; consequently, transistors 90' and 92' are active, while transistors 98' and 100' are turned off.)

For the sense amplifier 18, the pass gate transistors 90 and 92 are operated by a "select left" (Sel left) signal on gate line 106, and the pass gate transistors 98 and 100 are operated by a "select right" (Sel right) signal on gate line 108. Similarly, for the sense amplifier 19, the pass gate transistors 90' and 92' are operated by a "select left" (Sel left) signal on gate line 106', and the pass gate transistors 98' and 100' are operated by a "select right" (Sel right) signal on gate line 108'. Thus, in the embodiment shown, for the sense amplifier 18 to connect to cells of the active DRAM array 12 on its right and for the sense amplifier 19 to connect to cells of the same active DRAM array 12 on its left, the "Sel right" signal is applied to line 108 of sense amplifier 18, to activate transistors 98 and 100, and concurrently, the "Sel left" signal is applied to line 106' of sense amplifier 19 to activate transistors 90' and 92'. The "Sel left" signal is not applied to line 106 of sense amplifier 18, and the "Sel right signal is not applied to line 108' of sense amplifier 19, so that transistors 90, 92, 98' and 100' are not conducting.

Finally, sense amplifier selection pass gate transistors 110 connect the sense amplifier latch circuit 86 of sense amplifier stripe 18 to bus lines 82 and 84 of the global bus 31, and sense amplifier selection pass gate transistors 112 connect the sense amplifier latch circuit 88 of sense amplifier stripe 19 to bus lines 82 and 84 of the global bus 31. Pass gate transistors 110 and 112 are turned on by respective signals $Y_1$ and $Y_2$ on gate lines 114 and 116.

The sense amplifier circuitry may be replicated for each bit line pair in the respective adjacent DRAM arrays 11 and 12. Thus, for example, in the particular embodiment shown, a circuit similar to that containing latch 86 may be provided for every even numbered cell of the active DRAM array with which the sense amplifier stripe 18 is associated. Likewise, a circuit similar to that containing latch 88 may be provided for every odd numbered cell of the active DRAM array with which the sense amplifier stripe 19 is associated.

Other alternative arrangements, of course, may be employed. For example, rather than employing sense amplifier stripes on each side of the active DRAM array, a single sense amplifier stripe may be employed, such that the entire desired contents, for example a single page or row, of the active DRAM array may be loaded into the sense amplifiers of the single stripe. Thereafter, as explained below, first and second portions of the sense amplifiers of the stripe may be sequentially transferred to the cache or caches associated therewith. Furthermore, the sense amplifier transfers may be made in more than one transfer cycle. In such case, sets of sense amplifiers may be defined, with each receiving a respective portion of the contents of the active DRAM array.

Thus, in the embodiment shown in FIG. 3, it is intended that the contents of the sense amplifier stripes 18 and 19 will be transferred in two sequential cycles to respective caches. Accordingly, two cache latches 122 and 124 may be selectively connected to the lines 82 and 84 of the global bus 31. The cache latch 122 may be contained in cache stripe 26, and the cache latch 124 may be contained in cache stripe 27. The cache latch 122 may be connected to lines 82 and 84 by pass transistors 126 and 128, in response to a "Load Y1" signal on gate line 130. Similarly, the cache latch 124 may be connected to lines 82 and 84 by pass transistors 132 and 134, in response to a "Load Y2" signal on gate line 136.

In operation, data contained in the sense amplifier stripes 18 and 19 are sequentially transferred, for instance in response to sequential clock pulses 64 and 66, as shown in FIG. 2 to respective cache latches 122 and 124, in response to the sequential "Load $Y_1$" and "Load $Y_2$" signals. As mentioned, other embodiments may be envisioned in which the data may be transferred in more than two sequential cycles.

For example, if the data is to be transferred in three cycles, a third cache latch cell may be provided in correspondence to a third sense amplifier cell. This concept may be extended to four, five, or more sequential data transfer cycles. However, as a practical matter, since the DRAM array must be precharged prior to initiating the data transfers, the number of clock cycles at typical clock frequencies that exist between the initial precharge and subsequent bus availability may be practically limited to only two to four data transfers. Consequently, the circuit arrangement of the sense amplifier stripe elements and associated cache elements may be preferably constructed with a ratio of 1:2. As mentioned above, this enables the bus 31 to be constructed with half of the bus lines that would otherwise be required if the sense amplifier stripe elements and cache elements had a 1:1 ratio.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A memory architecture comprising:
   a plurality of sense amplifiers;
   an M-bit cache; and
   an n-bit global bus connecting the sense amplifiers and the M-bit cache,
   wherein n<M.

2. The memory architecture of claim 1, wherein n:M is 1:2.

3. The memory architecture of claim 1, wherein n:M is 1:4.

4. The memory architecture of claim 1, wherein n:M is greater than 1:2.

5. The memory architecture of claim 1, further comprising a plurality of memory arrays and wherein said sense amplifiers comprise pairs of sense amplifiers, each pair associated with one of said memory arrays.

6. The memory architecture of claim 5, wherein said plurality of memory arrays are a plurality of DRAM arrays.

7. The memory architecture of claim 6, wherein said sense amplifiers of each of said pairs of sense amplifiers are located on respective opposite sides of said associated DRAM array.

8. The memory architecture of claim 6, wherein said centralized cache is arranged in strips of cache elements, wherein said sense amplifiers are arranged in stripes of sense amplifiers, and wherein said DRAM arrays, said stripes of cache elements, and said stripes of sense amplifiers are arranged in a row.

9. A memory comprising:
a memory array of cells having stored memory contents;
a first sense amplifier array for receiving memory contents of a selectively associated first plurality of cells in said memory array;
a second sense amplifier array for receiving memory contents of a selectively associated second plurality of cells in said memory array;
a cache for receiving said memory contents from said first and second sense amplifier arrays;
a bus for connecting said first and second sense amplifier arrays to said cache; and
a circuit for sequentially transferring said memory contents of said first sense amplifier array to a first portion of said cache and transferring said memory contents of said second sense amplifier array to another portion of said cache.

10. The memory of claim 9 wherein said memory array is a DRAM array.

11. The memory of claim 9 wherein said circuit for sequentially transferring said memory contents of said first and second sense amplifier arrays does not require precharging of said DRAM array after said transfer is begun.

12. The memory of claim 9, wherein said bus has a number of bus lines equal to one-half of the sum of said first and second plurality of cells in said memory array.

13. The memory of claim 9 wherein said first and second sense amplifier arrays are physically interleaved.

14. The memory of claim 9 wherein said first and second sense amplifier arrays are located on respective opposite sides of said memory array.

15. The memory of claim 14 wherein said cache is located on one side of one of said first and second sense amplifiers.

16. The memory of claim 15, wherein said cache is arranged in strips of cache elements, wherein said first and second sense amplifiers are arranged in stripes of sense amplifiers, and wherein said memory array, said stripes of cache elements, and said stripes of sense amplifiers are arranged in a row.

17. A method for operating a memory comprising:
precharging a memory array;
sensing a first portion of addressed memory elements of said memory array in a first sense amplifier array;
concurrently sensing a second portion of said addressed memory elements of said memory array in a second sense amplifier array;
transferring said sensed first portion of said addressed memory elements of said first sense amplifier array to a cache;
and subsequently transferring said sensed second portion of said addressed memory elements of said second sense amplifier array to said cache.

18. The method of claim 17 further comprising determining a burst order required such that data necessary for a first portion of a burst is transferred on a first bus cycle, and data necessary for a second portion of the burst is transferred on a second bus cycle.

19. The method of claim 17 wherein said precharging a memory array comprises precharging a DRAM array.

20. The method of claim 17 wherein said subsequently transferring said sensed second portion of said addressed memory elements of said second sense amplifier array to said cache is accomplished without precharging said memory array after said transferring said sensed first portion of said addressed memory elements of said first sense amplifier array.

21. The method of claim 17 wherein said first and second sensed portions of said addressed memory elements each comprise one-half of said transferred portions.

22. The method of claim 17 wherein said first and second sense amplifier arrays are contained in first and second sense amplifier stripes.

23. The method of claim 17 wherein said first and second sense amplifier arrays are contained in a single sense amplifier stripe.

24. The method of claim 17 further comprising concurrently sensing a third portion of said addressed memory elements of said memory array in a third sense amplifier array, and transferring said sensed third portion of said addressed memory elements of said third sense amplifier array to said cache after transferring said sensed first and second portions of said addressed memory elements to said cache.

* * * * *